United States Patent [19]
Patterson

[11] Patent Number: 6,075,234
[45] Date of Patent: Jun. 13, 2000

[54] NON-CONTACT METHOD AND APPARATUS TO OBTAIN A TIMING SIGNAL FROM INTERNAL INTEGRATED CIRCUIT NODES

[75] Inventor: Joseph H. Patterson, Mission Viejo, Calif.

[73] Assignee: Silicon Systems, Inc., Tustin, Calif.

[21] Appl. No.: 08/995,866

[22] Filed: Dec. 22, 1997

[51] Int. Cl.⁷ .................................................. G01R 31/26
[52] U.S. Cl. ................... 250/207; 250/559.07; 324/754; 324/765
[58] Field of Search .............................. 250/207, 559.07, 250/559.08, 216, 214 R, 311; 324/532, 751, 752, 754, 755, 759, 765

[56] References Cited

U.S. PATENT DOCUMENTS 4,864,228  9/1989  Richardson .............................. 250/311
5,598,100  1/1997  Maeda et al. ............................ 324/765

*Primary Examiner*—Que T. Le
*Assistant Examiner*—Kevin Pyo
*Attorney, Agent, or Firm*—W. Daniel Swayze, Jr.; Wade James Brady, III; Frederick J. Telecky, Jr.

[57] ABSTRACT

A method and apparatus for triggering integrated circuit test equipment. More particularly, a method and apparatus for triggering integrated circuit test equipment by detecting photon energy emitted from a switching transistor on the integrated circuit. At the approximate moment in time when the switching transistor operates, photon energy is emitted. The photon energy typically in the form of light, is magnified and converted into an electrical signal. The electrical signal acts as a trigger to initiate the test equipment, such as data recording in the test equipment, at some predetermined time after emission of the photon energy. The recorded data can then be used to test and troubleshoot the integrated circuit.

8 Claims, 2 Drawing Sheets

NON-CONTACT METHOD AND APPARATUS TO OBTAIN A TIMING SIGNAL FROM INTERNAL INTEGRATED CIRCUIT NODES

BACKGROUND OF THE INVENTION

The present invention relates to integrated circuit test equipment. More particularly, the present invention relates to a method and apparatus for obtaining a timing signal in order to trigger integrated circuit test equipment.

An integrated circuit device typically consists of potentially millions of transistors on a single silicon substrate. Troubleshooting or otherwise probing an integrated circuit device is difficult and time consuming. First, the small size of the microelectronic circuitry combined with the high transistor density makes it difficult to locate faults. Second, because a particular sub-circuit, commonly referred to as a ìblock,î on the integrated circuit might operate asynchronously, determining when to examine a particular transistor in the block is problematic. That is, it is difficult to determine when a particular transistor in the block will be switching. This is the result of asynchronous operation which means that the transistors switch independently of any common clock signal that might otherwise act as a block trigger. Third, the fault might not be a manufacturing fault. Rather, it could be a functional fault, meaning that the transistor is functioning as designed, but the sub-circuit design is faulty. In such a case, troubleshooting becomes more complicated because the entire sub-circuit must be evaluated, not just one transistor.

One known manner of troubleshooting or probing an integrated circuit involves physical contact. That is, one must physically connect probes to particular portions of the integrated circuit. The probes can be connected to an oscilloscope or other potential measuring devices. In this way, the potential at a particular transistor can be measured over time.

Contact methods and apparatus like probes have disadvantages. It is difficult to position the probe given the minute size of the microelectronic circuitry under scrutiny. Additionally, the point to be probed may not be readily accessible. For example, the probe point may be difficult to reach given the minute size and multiple layering of the individual integrated circuit elements. For example, the probe point might be beneath the surface of the integrated circuit. In such a case, a probe point hole must be made. If the probe point hole is improperly made, it may result in incorrect measurements. Additionally, the probe hole might damage other lines or channels, resulting in altered circuit performance further frustrating troubleshooting efforts. Where the integrated circuit has test nodes, probing the nodes generally will not yield information as to how specific transistors are operating at a specific time. Other disadvantages of probes include capacitive loading of the circuit caused the probe and associated instrumentation. Capacitive loading can alter the potential of the point being measured. Furthermore, if the point being checked is near a power source or powered line, the probe data might include crosstalk noise.

Non-contact prior art methods and apparatus also have disadvantages. That is, there is no way to utilize non-contact methods on an asynchronous circuit. For example, one non-contact method includes measuring the potential using an electron beam probe. The electron beam probe directs a beam of electrons at a particular conductor in the integrated circuit. By measuring the energy distribution of the secondary electrons produced in response to the electron beam bombardment, the potential at the conductor can be measured.

The disadvantage of the prior art electron beam probe is that it must be turned on and off (triggered) at a particular point in time. This is not difficult for synchronized circuits in which a clock pulse or other synchronized signal can be obtained through contact methods and apparatus. This signal can then be used to trigger the electron beam probe at the appropriate time. But obtaining the synchronization signal through contact methods and apparatus involves the same disadvantages associated with probes discussed above. Moreover, where the sub-circuit under probe is asynchronous in operation, there is no signal available for triggering on the e-beam testor. Therefore, non-contact methods frequently cannot be used on asynchronous circuits.

It can be seen that a non-contact method and apparatus of obtaining a signal to trigger integrated circuit test equipment is needed.

SUMMARY OF THE INVENTION

The invention addresses the above needs and overcomes the disadvantages of the prior art. The invention is directed to a non-contact method and apparatus of obtaining a signal to trigger integrated circuit test equipment. More particularly, the invention is directed to a non-contact method of triggering integrated circuit test equipment by detecting light emission from the test site on the integrated circuit.

The transistors in integrated circuits emit photon energy upon switching. The present invention detects photon energy emission n typically in the form of light—from a switching transistor on the integrated circuit. Upon detection of such light, a trigger signal is transmitted to test equipment which initiates data recording. The test equipment can therefore record relevant data about the circuit at the approximate time the trigger signal is generated, e.g., at the time when the transistor switches.

In one embodiment of the present invention, an optical microscope is focused upon the particular element in the sub-circuit, namely a transistor. The optical microscope detects and magnifies the photon energy released when the transistor switches. A photomultiplier tube (PMT) is connected to the optical microscope. The PMT further magnifies the photon energy signal received from the optical microscope. The PMT is connected to a pulse amp. A pulse amp electrically conditions the enhanced signal received from the PMT. Essentially, the output of the pulse amp is an electrical signal which acts as a trigger. The output of the pulse amp, i.e., the trigger, is directed to the instrumentation monitoring relevant parts of the integrated circuit. The trigger therefore initiates recording in the instrumentation at the approximate time the photon energy is released.

In another embodiment of the present invention, the instrumentation includes a CCD camera and a light emission microscope (LEM). The LEM can be focused on and magnify the test site and surrounding circuitry of the integrated circuit. The output of the LEM is connected to a CCD camera. The CCD camera begins recording data provided by the LEM at the approximate time the CCD camera receives the output of the pulse amp. That is, at approximately the same time the photon energy is emitted by the test site, the trigger signal is sent from the pulse amp to the CCD camera. The CCD camera records data concerning the test site and surrounding circuitry. The data can be compared to the circuit schematics and circuit layout to assess which transistors were switching at the instant in time that the test site emitted photon energy.

In another embodiment of the present invention, the instrumentation includes an e-beam probe, an electron detector and a recorder. The e-beam probe bombards the test site with electrons. The secondary electrons reflected off the test site are measured by an electron detector. In this way the potential at the test site and surrounding circuitry can be measured. The measurements are sent to a recorder, but the recorder does not accept the data until a trigger (i.e., signal) is received from the pulse amp. The pulse amp transmits the trigger at the approximate time the test site emits photon energy. The resulting recorded data yields information as to the potential of the test site and surrounding circuitry at the approximate time photon energy is emitted by the test site.

It is therefore an object of the invention to use emitted photon energy from an integrated circuit to trigger integrated circuit test equipment. It is a further object of the invention to gather operational data on portions of integrated circuits using detection of photon energy emitted from the integrated circuit. It is a further object of the invention to allow information to be gathered from an asynchronous circuit using non-contract instrumentation. It is a further object of the invention to reduce the time and money spent analyzing faults on integrated circuits, especially integrated circuits that operate asynchronously. It is a further object of the invention to reduce the time it takes to get an integrated circuit to market by reducing the time spend analyzing faults on integrated circuits.

BRIEF DESCRIPTION OF THE DRAWINGS

The above and related objects, features, and advantages of the present invention will be more fully understood by reference to the following detailed description of the present invention, albeit illustrative, when taken in conjunction with the accompanying drawing wherein.

DETAILED DESCRIPTION OF THE INVENTION

The embodiments of the invention are now described with reference to the figures where like reference numbers indicate like elements.

Figure 1:
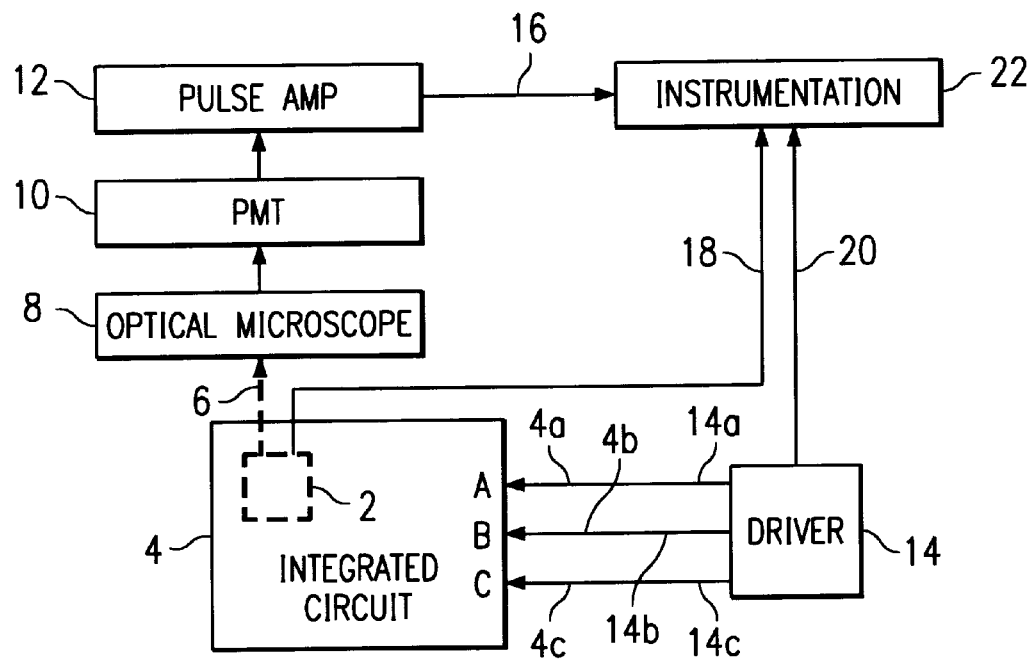
FIG. 1 is a block diagram of a non-contact test setup in accordance with the invention.

Turning to FIG. 1, an embodiment of the present invention is depicted. An integrated circuit 4 includes a test site 2. Test site 2 may be a transistor or, as previously defined, may include surrounding circuitry.

The inputs 4a–c carry electrical data to integrated circuit 4. The electrical data is generated by a driver 14. Driver 14 is shown with three outputs 14a–c. Outputs 14a–c carry electrical data and are electrically connected to inputs 4a–c. In turn, the inputs 4a–c route electrical data to the integrated circuit 4. The number of inputs and connections between integrated circuit 4 and driver 14 can be varied without departing from the spirit and scope of the present invention.

The data provided to integrated circuit 2 is processed by integrated circuit 4. At some time during the processing, a transistor included in test site 2 will switch states. Upon switching, test site 2 emits photon energy 6. Photon energy 6 is detected by an optical microscope 8, which has been focused on test site 2.

Optical microscope 8 magnifies detected photon energy 6. Optical microscope 8 is connected to a photomultiplier tube (PMT) 10. PMT 10 is a known device which converts photon energy to a corresponding electrical signal. That is, PMT 10 internally collects photon energy using photocathode. The photocathode converts the photon energy to electron energy. The electron energy is enhanced in PMT 10 by using a electron multiplier. The result is an electrical signal corresponding to the photon energy input. PMTs are well known. Generally, PMTs with a fast response time and low noise are desirable.

PMT 10 is connected to a pulse amp 12. Pulse amp 12 receives the electrical signal from the PMT 10. Pulse amp 12 conditions the electrical signal to function as a trigger signal. Pulse amp 12 does so by amplifying the PMT 10 output and shaping it to form a well defined output signal, trigger 16. Pulse amp 12 can be any known circuitry which alters the PMT 10 output to comprise trigger 16 having a fast rise time over a relatively short time duration. Trigger 16 can have a variety of shapes as discussed below. Pulse amps capable of generating a trigger include those manufactured and commercially available, e.g., by M.I.T. Incorporated.

Instrumentation 22 monitors test site 2 and surrounding circuitry via a link 18. Link 18 can be any connection formed between instrumentation 22 and test site 2. For example, link 18 can be a pathway along which instrumentation 22 bombards test site 2 with an electron beam in order to gather information concerning electrical potentials associated with test site 2 and surrounding circuitry. Likewise, link 18 can be an optical pathway, including beam splitters and mirrors, whereby instrumentation 22 receives optical information concerning test site 2 and surrounding circuitry. This can be useful where instrumentation 22, e.g., a light emission microscope, gathers optical information like photon energy emitted from test site 2 and surrounding circuitry via link 18.

Instrumentation 22 can also monitor driver 14 via connection 20. In this way, instrumentation 22 can receive and record the data that driver 14 inputs to integrated circuit 4. Accordingly, by monitoring both driver 14, test site 2 and surrounding circuitry, instrumentation 22 can be used to assist in troubleshooting integrated circuit 4. In this manner, correlating the data input by driver 14 and data received by test site 2 and surrounding circuitry, instrumentation 22 monitors, records and yields information concerning the operation of integrated circuit 4.

Instrumentation 22 records data concerning integrated circuit 4 at the approximate time trigger 16 is received. Specifically, trigger 16 is received by instrumentation 22 at the approximate time photon energy 6 is emitted from test site 2. In this way, instrumentation 22 can record data concerning the integrated circuit 4, test site 2 and driver 14 at the approximate time test site 2 switches states.

Driver 14 generates input signals to integrated circuit 4, which can include data for integrated circuit 4 to process. The driver output 14a–c corresponds to the input 4a–c to integrated circuit 4. Essentially, driver 14 generates data for integrated circuit 4 to process. Three connections are shown in FIG. 1 for convenience, although the actual number can vary. Driver 14 generates data for integrated circuit 4 to process. Driver 14 can be the actual equipment intended to interface with integrated circuit 4. Alternately, driver 14 can be special test equipment, for example, an emulator.

Test site 2 is a transistor or part thereof located in integrated circuit 4. During operation of integrated circuit 4, test site 2 will switch states. That is, transistors typically operate in a logic 0 or 1 state. By monitoring the time and circumstances of test site 2 changing state, the integrity of test site 2 and the surrounding circuitry can be evaluated.

That is, data concerning when test site 2 changed states and how other elements were responding to inputs from driver 14 will yield important insight into the operation of integrated circuit 4.

Upon test site 2 switching states, photon energy is released. This phenomenon is described in "A Study of Photon Emission from n-Channel MOSFET's" published in the Vol. 34, No. 7, July 1987 edition of Spectrum, an IEEE publication, which is incorporated herein by reference. As discussed, photon energy 6 will vary in energy and wavelength depending on the doping levels of the transistor, the type of transistor, and the voltages and currents in the transistor.

Optical microscope 8 is used to locate the test site 2. Integrated circuit 4 is placed in view of optical microscope 8. Any well known device can be used to hold integrated circuit 4 in view of optical microscope 8. For example, a stage is often used. A stage is a device which mechanically secures the integrated circuit and also allows a technician to precisely move the integrated circuit to a desired orientation which facilitates study on the integrated circuit. Inputs 4a–c can be electrically connected to integrated circuit 4 which integrated circuit is secured to the stage.

Optical microscope 8 can be used to view the surface of integrated circuit 4 using high magnification, typically 500x, although the magnification can vary depending on type and complexity of integrated circuit 4. Layout drawings and schematics of integrated circuit 4 can assist in locating test site 2. Locating various elements of an integrated circuit by using layout drawings and schematics is described in U.S. Pat. No. 5,530,372, which is incorporated herein by reference. By comparing the layout drawings, masks, schematics or other documents regarding the expected layout of integrated circuit 4 with the actual view of integrated circuit 4 provided by optical microscope 8, test site 2 can be located on integrated circuit 4.

Photon energy 6 emitted by test site 2 is magnified by optical microscope 8. The magnified photon energy is received by PMT 10, which collects the photon energy. PMT 10 converts the photon energy into a corresponding electrical signal. PMT 10 output is received by pulse amp 12.

Pulse amp 12 receives the output of PMT 10. Pulse amp 12 further amplifies and shapes the electrical signal from PMT 10. The output of pulse amp 12 is a well defined signal such as a square wave or a pulse which can be used to initiate recording in instrumentation 22. That is, the output of pulse amp 12, trigger 16, is used to initiate recording in instrumentation 22.

The electrical shape of trigger 16 can vary depending upon the internal circuitry of pulse amp 12. Trigger 16 can be a square wave. Alternately, trigger 16 can be a pulse having an extremely high rise time over an extremely short time duration. Regardless of shape, it is important that trigger 16 have a uniquely recognized feature, such as a front edge with a rapid rise time, so that trigger 16 can be detected causing instrumentation 22 to begin recording data.

Trigger 16 is output from pulse amp 12 at the approximate time photon energy 6 is released. Accordingly, at that approximate time, trigger 16 initiates recording in instrumentation 22. Instrumentation 22 can record data concerning test site 2 and the surrounding circuitry on integrated circuit 4. The data is received by instrumentation 22 through link 18, which can be an optical or electrical connection as discussed further below. Likewise, at the same approximate time, instrumentation 22 can record data concerning driver 14 by electrical connection 20.

With a definition of the test setup now complete, a method of triggering integrated circuit test equipment using photon energy emission will now be described. The layouts, masks and schematics of integrated circuit 4 are reviewed to find a particular test site 2 on integrated circuit 4. Optical microscope 8 is used to magnify portions of the integrated circuit 4 until test site 2 is located. Once test site 2 is located, optical microscope 8 is connected to PMT 10 and pulse amp 12. At this point in time, at least according to a presently preferred embodiment, the integrated circuit can be activated.

Driver 14 is electrically connected to integrated circuit 4. Driver 14 is activated and begins generating a series of signals. The signals consist of digital pulses generated over time typically in a particular predetermined test pattern. The digital pulses are output on connections 14a–c. The signals from driver 14 are received by integrated circuit 4 through input connections 4a–c. More connections between integrated circuit 4 and driver 14 can be provided, as may be necessary to operation of the former. Integrated circuit 4 begins processing the signals received from driver 14. At some time $t_0$, test site 2 switches states and, as a result, photon energy 6 is released.

Optical microscope 8 magnifies photon energy 6 released from test site 2. The PMT 10 enhances the photon energy 6 magnified by microscope 8 and converts it to electricity. Pulse amp 12 further shapes the electrical signal into trigger 16. Trigger 16 is received by instrumentation 22 at approximately time $t_0$. Receiving trigger 16, instrumentation 22 begins recording data concerning test site 2 and the surrounding circuitry through link 18. Likewise, at time to instrumentation 22 can begin recording information concerning driver 14. Accordingly this method yields information concerning integrated circuit 4, and more particularly test site 2, at time $t_0$ by using detection of photon energy 6 as a trigger for instrumentation 22.

In the above example, trigger 16 is received by instrumentation 22 at approximately time $t_0$, the time when photon energy 6 is released from test site 2. However, under certain circumstances, it can be advantageous to initiate recording at some predetermined time $t_0+x$. That is, under certain circumstances it may be advantageous to delay data recording concerning test site 2 and the surrounding circuitry, at some predetermined time x after test site 2 emits photon energy 6. In such a case, any well-known delay circuitry can be utilized to delay recording of instrumentation 22 until some predetermined time $t_0+x$, where x is the desired time delay. Variable delay circuitry can be built internally to instrumentation 22 or pulse amp 12. Alternately, delay circuitry can be added as a discrete component.

Figure 2:
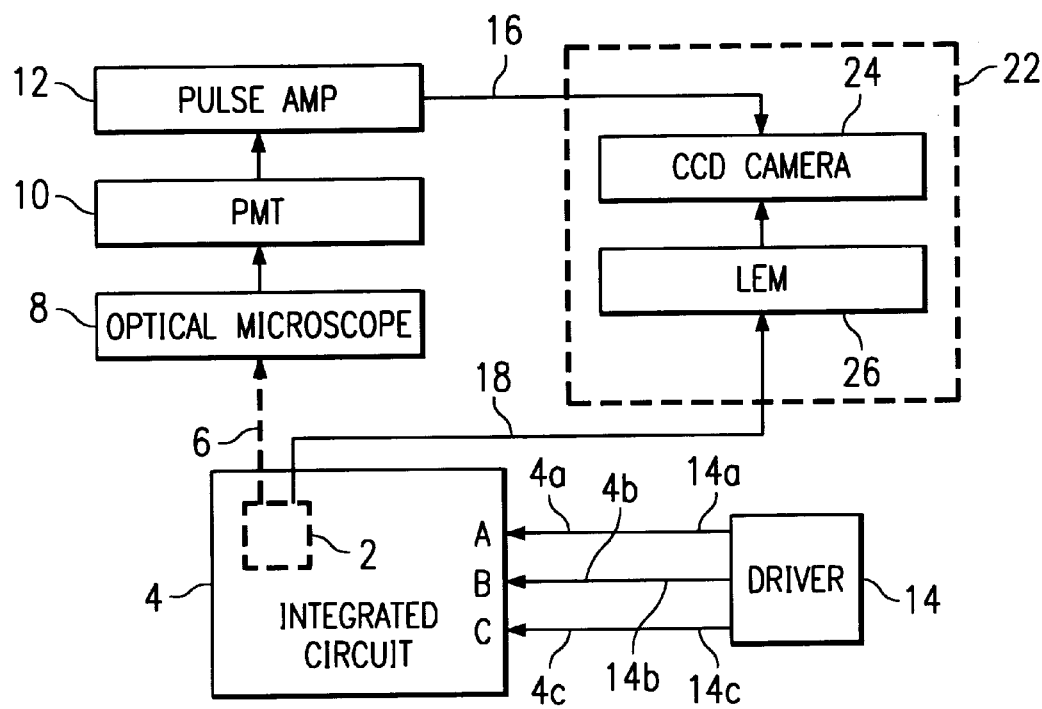
FIG. 2 is a block diagram of another embodiment of a test setup according to the invention which utilizes an LEM and a CCD camera.

Turning now to FIG. 2, another embodiment of the present invention is depicted. Instrumentation 22 includes a light emission microscope (LEM) 26 and a CCD camera 24. LEM 26 is a well known instrumentation device and can be purchased commercially, e.g., the Hypervision Visionary 2000 is one known LEM. LEM 26 produces an optical image which is sent to CCD camera 24. CCD camera 24 is a digital camera which can digitize the optical image provided by LEM 26. The CCD camera 24 is part of an intensified camera. In front of the CCD camera there are microchannel plates. Microchannel plates, in part, transfer the optical image received by the LEM 26 into a corresponding electrical image that can be digitized by the CCD camera.

LEM 26 is focused on and magnifies test site 2. That is, LEM 26 is optically connected to test site 2 as depicted by link 18. In this case, link 18 is an optical pathway which allows LEM 26 to focus test site 2, and if desired, circuitry surrounding test site 2. For example, link 18 can include beam splitters and mirrors which provide LEM 26 an optical pathway to receive optical information concerning test site 2 and surrounding circuitry. In this way, once recording is commenced at approximately time $t_0$, or some predetermined time x thereafter, the recorded data will include information concerning test site 2 and any surrounding circuitry, if desired.

The optical image from LEM 26 is transmitted to CCD camera 24. CCD camera 24 does not record the optical image until it receives trigger 16. That is, at the approximate time when photon energy 6 is released from test site 2, or some predetermined time thereafter, trigger 16 causes CCD camera 24 to record the image transmitted from LEM 26. The CCD camera 24 captures an image circuitry on integrated circuit 4. The image reveals which transistors are switching at the time CCD camera 24 receives trigger 16. This information can be compared with the layouts and schematics of integrated circuit 4. By doing so, it can be determined which transistors were switching at the point in time which trigger 16 was received. This information assists in troubleshooting integrated circuit 4.

Figure 3:
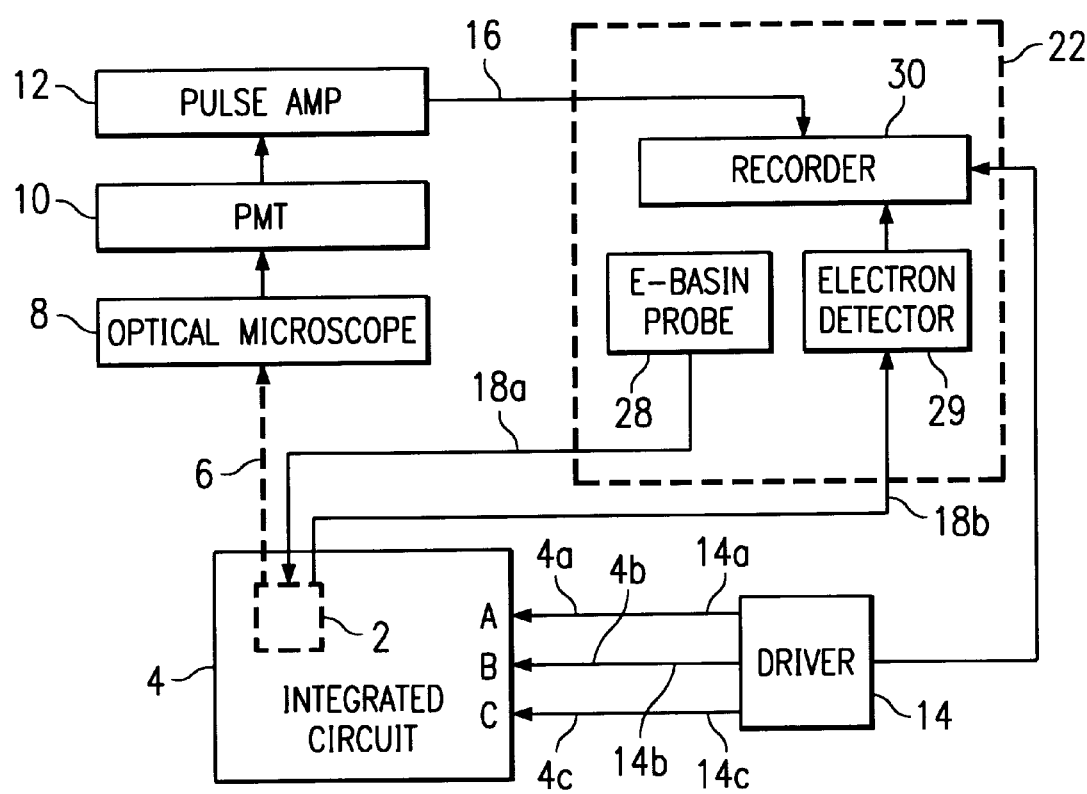
FIG. 3 is a block diagram of another embodiment of a test setup according to the invention which utilizes a e-beam probe, an electron detector and a recorder.

Turning now to FIG. 3, another embodiment of the present invention is depicted. Instrumentation 22 includes a recorder 30, an e-beam probe 28 and an electron detector 29. The e-beam probe 28 and electron detector 29, sometimes referred to as a scanning electron microscope (SEM), are discussed in further detail in U.S. Pat. No. 4,706,019, which is incorporated herein by reference.

The e-beam probe 28 emits electrons 18a which bombard test site 2. The secondary electrons 18b reflect off of test site 2 and surrounding circuitry of integrated circuit 4. Secondary electrons 18b are received by electron detector 29. That is electron detector 29 collects and measures the electrons associated with secondary electrons 18b. In this way, the waveform of the bombarded area can be measured. The bombarded areas can include, for example, test site 2 and any surrounding circuitry. Accordingly, the potential of various locations on test site 2 and surrounding circuitry can be measured.

According to another aspect of this embodiment, the data from electron detector 29 may be transmitted to a recorder 30. Recorder 30 does not record data provided from electron detector 29 until it receives trigger 16 in the presently preferred embodiment. That is, at time $t_0$ when photon energy 6 is released from test site 2, or some predetermined time thereafter, trigger 16 causes recorder 30 to store data from the electron detector 29. Modifications can be made to allow recorder 30 to also receive and record information concerning integrated circuit 4. For example, recorder 30 could receive and record information from driver 14 concerning data input to integrated circuit 4. Likewise, modifications can be made to allow recorder 30 to receive and record information directly from integrated circuit 4 by any well known means where such information would assist in troubleshooting integrated circuit 4.

It is intended that the invention not be limited to the embodiments specifically set forth, but limited only by the scope of the appended claims including the full range of equivalency to which each element of each claim is entitled.

What is claimed is:

1. A method of triggering integrated circuit instrumentation by detecting photon energy emitted from a test site located on an integrated circuit comprising the steps of:

operating said integrated circuit;

detecting said photon energy emitted from said test site;

generating a trigger in response to said photon energy being emitted from said test site at a predetermined time subsequent to emission of said detected photon energy;

applying said trigger responsive to said photon energy at a predetermined time to said instrumentation in order to initiate data recording; and recording data concerning said integrated circuit at a predetermined time subsequent to emission of said photon energy.

2. The method according to claim 1 wherein operating said integrated circuit further comprises the step of applying a predetermined plurality of input signals to said integrated circuit.

3. The method according to claim 1 wherein detecting photon energy emitted from said test site comprises the steps of:

magnifying said photon energy emitted from said test site using an optical microscope, said optical microscope output connected to a photomultiplier tube; and enhancing said photon energy with said photomultiplier tube.

4. The method according to claim 3 wherein the step of generating a trigger at a predetermined time subsequent to emission of said photon energy comprises the step of:

shaping said photomultiplier output using a pulse amp, said pulse amp output constituting said trigger.

5. A method of triggering integrated circuit instrumentation by detecting photon energy emitted from a test site on an integrated circuit comprising the steps of:

operating said integrated circuit;

detecting said photon energy emitted from said test site using an optical microscope for magnifying said photon energy emitted from said test site, said optical microscope output received by a photomultiplier tube;

enhancing said photon energy with said photomultiplier tube;

converting said photon energy into a corresponding electrical signal;

shaping said electrical signal using a pulse amp;

outputting a trigger signal responsive to said photon energy from said pulse amp;

creating an optical image of said integrated circuit using a light emission microscope;

receiving said optical image of said integrated circuit with a CCD camera; and applying said trigger at a predetermined time to activate said CCD camera and initiate recording in said CCD camera in response to detecting said photon energy emitted from said test site.

6. The method according to claim 5 further comprising the steps of:

directing electrons emitted from an e-beam probe to a portion of said integrated circuit;

receiving said electrons reflected off said portion of said integrated circuit;

measuring electrical potential of said portion of said integrated circuit;

applying said trigger at a predetermined time to initiate recording of data, said data including electrical potential of said portion of said integrated circuit.

7. An apparatus for creating a timing signal for integrated circuit test instrumentation comprising:

optics capable of magnifying photons released from a test site on an integrated circuit;

a photomultiplier tube optically connected to said optics for converting said photons into a corresponding electrical signal responsive to said photons being released from said test site; and a pulse amp electrically connected to said photomultiplier, said pulse amp for conditioning said electrical signal whereby said electrical signal initiates recording of data by said test instrumentation concerning said integrated circuit.

8. The apparatus of claim 7 further including circuitry for delaying said electrical signal for a predetermined time after said photons are released from said test site.

* * * * *